United States Patent [19]
Bartelink

[11] Patent Number: 5,140,388
[45] Date of Patent: Aug. 18, 1992

[54] VERTICAL METAL-OXIDE SEMICONDUCTOR DEVICES

[75] Inventor: Dirk J. Bartelink, Los Altos, Calif.

[73] Assignee: Hewlett-Packard Company, Palo Alto, Calif.

[21] Appl. No.: 673,703

[22] Filed: Mar. 22, 1991

[51] Int. Cl.$^5$ .............................................. H01L 29/10
[52] U.S. Cl. .................. 357/23.4; 357/23.7; 357/41; 357/46; 357/55
[58] Field of Search .............. 357/23.4, 23.7, 41, 357/46, 55

[56] References Cited
U.S. PATENT DOCUMENTS 4,622,569 11/1986 Lade et al. ........................ 357/23.4
4,951,102 8/1990 Beitman et al. .................... 357/23.4

Primary Examiner—Edward J. Wojciechowicz

[57] ABSTRACT

A vertical CMOS semiconductor device and a method of making the device. A polysilicon gate post rises normal to a surface of a substrate. An annular transistor encircles the gate post. The transistor consists of a channel layer sandwiched between a pair of source/drain layers. Each layer lies directly above the layer beneath, with the gate post projecting up through the layers. One or more additional transistors of the same or differing polarities may be stacked above the first transistor, the various transistors being suitably spaced apart from each other. Electrical connections with the gate post and the various source/drain layers may be configured to provide a complementary inverter or some other circuit as desired.

14 Claims, 8 Drawing Sheets

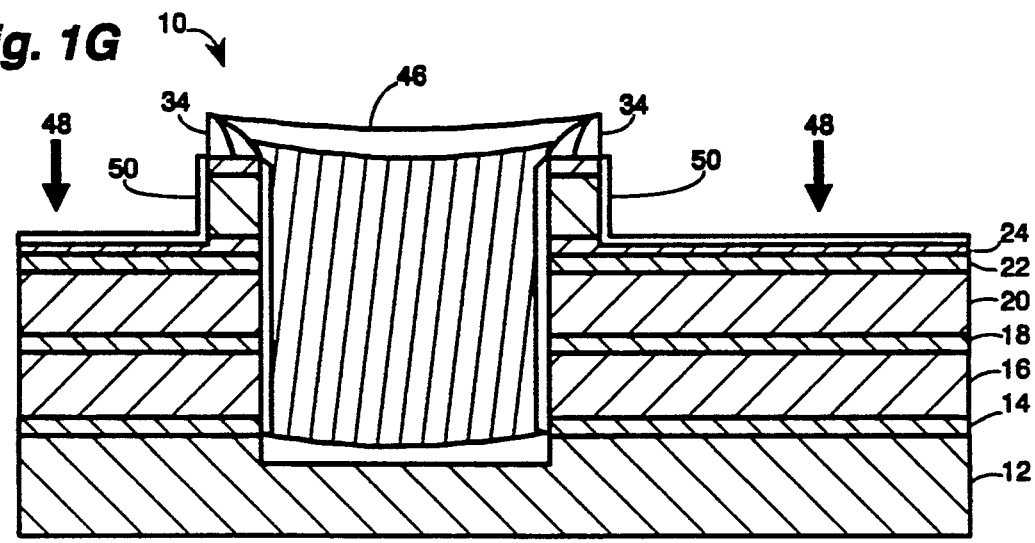
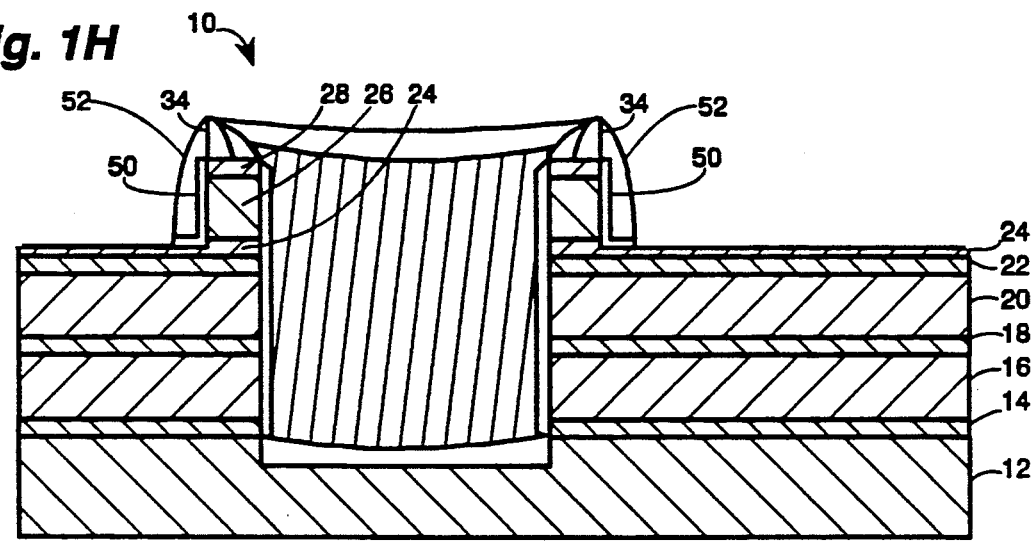
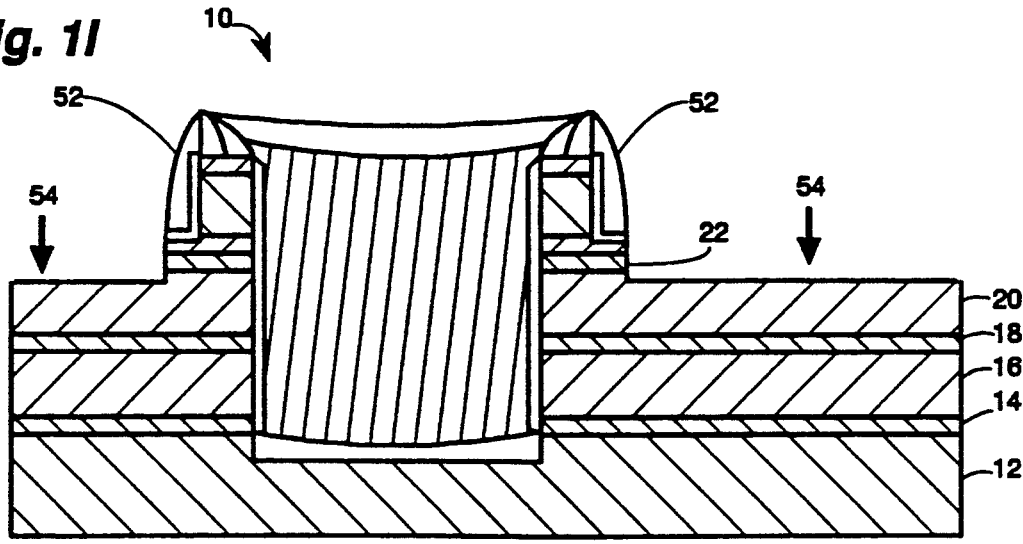

VERTICAL METAL-OXIDE SEMICONDUCTOR DEVICES

BACKGROUND OF THE INVENTION

The present invention relates to metal-oxide semiconductor devices and, more particularly, to vertical MOS devices and their fabrication. A major objective of the present invention is the fabrication of vertical CMOS components.

The rapidly expanding microelectronics industry continues to develop new technologies and process refinements, yielding extremely dense circuitry upon single semiconductor chips. The number of components that may be included on a single silicon integrated circuit nearly doubles every year. Advances in microelectronics have had a major impact on the size and cost of computer hardware. The increasing capacity of semiconductor memory devices has provided cheap, efficient means of accessing and storing large amounts of information. Further, the means to integrate a central processing unit on a single chip has allowed the incorporation of powerful computing systems in automobiles, appliances, and in home and office computers.

Several technologies exist for producing microelectronic circuits in semiconductor materials. Scientists first explored bipolar technology, using the operational principles of the original transistor, to create small-and medium-scale integrated circuit devices, each having upwards of 200 separate logical gates on a single silicon substrate. Metal Oxide Semiconductor technology (or MOS), while conceptually simpler than bipolar technology, did not emerge until later, because of material problems associated with making high-quality gate oxides.

The MOS fabrication procedure starts with a thin silicon wafer, from which each IC chip will be cut. The wafer is cut from a pure silicon crystal doped with impurities to be either a p-type or n-type material. P-type semiconductors possess an excess number of "holes", or positively-charged carriers. N-type semiconductors possess an excess number of electrons, or negatively-charged carriers.

Typically, the MOS transistor is laid out across the surface of the silicon wafer, which for this example will be of p-type silicon. Two n-type regions are formed in an upper silicon layer by diffusing impurities at specific areas on the silicon surface. These regions are usually referred to as the "source" and "drain" terminals of the device and are separated by a "channel" region, composed of the original p-type silicon material. A third terminal of the device, termed the "gate", comprises a layer of polycrystalline silicon (polysilicon) deposited on top of a thin (typically 100–200 Å thick) insulating layer of silicon dioxide. The gate is positioned directly over the channel region of the MOS transistor, and is normally heavily diffused with impurities so that it behaves as a good conductor.

The gate acts as one plate of a capacitor, while the relatively low-conductivity silicon channel acts as the other plate. A sufficiently positive potential applied to the gate electrode induces a negative charge in the silicon semiconductor and acts to repel the majority carrier (the holes) from the channel region's surface. As the potential applied to the gate increases, so too does the concentration of minority carrier electrons at the interface between the oxide and the silicon substrate and eventually this minority concentration becomes comparable with the density of majority carrier holes to produce what is termed an inversion layer. Since the inversion charge at the oxide-semiconductor interface provides a conductive channel between the source and drain, a potential difference applied between these two electrodes causes a current to flow between them. The device is then said to be in the ON state and the gate voltage required to allow conduction to occur is known as the threshold voltage. Prior to inversion, the channel is not formed, hence no current can flow, and the device is said to be OFF. The gate of a MOS transistor therefore acts as a switch, between the source and drain, which is open or closed depending on the voltage applied to the gate.

The MOS transistor is the central element in many integrated circuit applications, allowing electronics designers to cascade logical on/off devices by replicating and connecting together an array of MOS transistors across a silicon chip. An extremely important factor in the advancement of integrated circuit technology has been the scaling down of device dimensions. Until recently, the manufacturing penalty which has been required to achieve scaling reductions has been low and has been considerably outweighed by the resulting improvements in circuit performance. Stated algebraically, if all dimensions of a device are scaled by a given factor k, the scaling provides a $k^2$ increase in devices on a given sized chip. The commonly-used constant field approach to scaling assumes that as the dimension scales so do all voltages (both supply and threshold voltages) within the circuit by the same ratio, so that the current in the chip will also be reduced by k and the power dissipated in each device by $k^2$. Therefore the overall power consumption of a chip of given size remains unaltered. A further benefit of scaling is that individual gates operate k times faster. Therefore, the functional throughput of the chip (defined as the number of gates multiplied by the clock rate of the device divided by its power consumption) should scale as $k^3$. Since functional throughput increases so dramatically while holding power requirements constant, there are enormous benefits gained from scaling MOS integrated circuits to ever smaller sizes.

Recently, however, production and material limitations have begun to hamper continual reduction of MOS circuit size. Several considerable production limitations involve the ability to fabricate structures reproducibly across a whole wafer as one shrinks each surface feature. Integrated circuits are laid out onto silicon wafers by photolithographic processes, whereby a succession of different photographic plates bearing the locations and sizes of individual features (for example, the source regions across a chip) are optically projected onto a wafer coated with photoresist. The photoresist hardens during subsequent processing in those places where it is exposed. These hardened areas form a mask for subsequent etching or impurity implantation steps. However, as the dimensions of IC devices approach the wavelengths used by the optical projectors, diffraction effects begin to blur fine circuit patterns, degrading manufacturing control. Hence the ability to define and resolve patterns of this size using conventional optical lithographic techniques ultimately becomes diffraction limited, such that continuously shorter wavelengths are needed.

Further, imaging individual patterns is itself not sufficient for the fabrication of a large scale integration (or LSI) chip; patterns must also be aligned (or registered) in the correct place relative to previous ones. For this reason the minimum linewidth that can be used for LSI chips is not the smallest that can be imaged onto a silicon wafer, but the smallest that can be controlled within critical tolerances. Typically, the mask for a single chip begins with a reticle plate containing an enlarged (perhaps by 5 times) image of the patterns appropriate to one layer on one chip. The image is then photoreduced and repeatedly stepped over a two-dimensional array to produce a final mask. A series of these masks are used to lay out each successive process step in the production of the completed integrated circuit. Registration can be improved by using single-chip masks and reduction-projection printers, which step the individual chip pattern over the entire wafer. These projection systems offer advantages (over prior full wafer printers) of higher resolution, better chip-by-chip alignment and less sensitivity to dust on the mask. However, they are more expensive, take longer to expose a wafer, and, ultimately, also suffer from alignment and resolution problems as the complexity in the number of masks (and integrated devices) increases and the size of individual device elements grows smaller. As circuit features shrink in size, the alignment, or registration, of successive patterns becomes increasingly difficult.

Self-alignment in semiconductor processing has been attempted to solve registration problems and limit the number of masks required. In a self-aligning process, certain features or spacers are created in the semiconductor wafer using conventional masks. Spacers may be created by forming a conformal deposit of an oxide or nitride, and then using an anisotropic etch to remove the deposit from horizontal areas but leave thin deposited spacers along vertical walls (for instance, the walls of a patterned photoresist mask). These spacers then function as a secondary mask in further processing steps. By using the spacer portions of the layout to mask other wafer areas, circuit features can be aligned to one another by a natural and accurate process. The number of masks required is also reduced. While widely used in MOS processing, self-alignment techniques are often limited to only suitable device designs, however, they still provide attractive methods for scale reductions.

In addition to problems inherent in the photolithographic methods of producing very large scale integrated (or VLSI) circuits, several fundamental material and device structure problems also limit the scale reductions of current MOS-technology ICs. As the channel length, the distance between the MOS transistor's source and drain regions, decreases, the depletion regions formed at the source-to-substrate and the drain-to-substrate p-n junctions begin to overlap. When this occurs, control of the device by the gate electrode is lost. The width of these depletion regions can be decreased by either reducing the circuit supply voltage or by increasing the substrate doping concentration. However, increasing the doping concentration also increases the electric field required at the gate to turn the MOS transistor on, and this field must be maintained below the breakdown field of the oxide layer separating the gate from the channel region. In addition, parasitic capacitance goes up, slowing circuit operation. Hot electron degradation has been perhaps the major limitation on scale-reductions in VLSI circuits. In order to avoid the onset of avalanche in MOS transistors, the electric field in the channel region must be maintained within certain limits. As channel length shrinks, channel voltage must therefore also decrease, leading to reduced current flow and slower circuit operation. However, in addition to these problems, the threshold operation voltage $V_T$ proves to be a fundamental limit to scaling of MOS transistor devices, preventing further decreases in voltage.

Another major problem in scaling MOS transistors results from the relationship of the channel region's depth to its length. As these two dimensions become comparable, current not only flows directly through the channel from source to drain, but also (at high enough electric fields) through the substrate, having deleterious effects on MOS operation. At small geometries and high terminal biases, some of the parasitic current can flow from the source to the drain, outside of the MOS channel. Under what is termed parasitic bipolar action, the source-to-substrate junction can then become forward biased, causing electrons to be injected into the substrate. Although much of the current will be collected by the drain, some will diffuse several hundred microns away and interfere with the operation of other parts of the circuit. Another deleterious effect of excess injected electrons is that of latch-up. Latch-up occurs where neighboring transistor areas form a parasitic NPNP diode. The NPNP diode can suddenly turn on by virtue of the parasitic current once current flow between the two transistor regions is made to cross a critical threshold, interrupting normal circuit operation, and even permanently damaging the circuitry.

To attempt to eliminate the spurious parasitic currents in MOS microelectronic circuits, attention has been placed on so-called silicon-on-insulator (or SOI) technologies. The motivating idea behind these new approaches is that of eliminating the portion of the silicon substrate which extends below the actual MOS transistor. Current in an SOI transistor would have nowhere else to flow but through the channel region itself. SOI technology isolates one circuit component from another by allowing the construction of each component in its own "island" of silicon. The various SOI techniques promise design and process simplicity, high circuit density and immunity from the effects of parasitic transistor activity. In addition, SOI technology promises to lessen the effects of hot electron degradation when scaling circuit devices to smaller dimensions.

One potential SOI technique employs a substrate of sapphire and is termed silicon-on-sapphire. The process involves depositing an epitaxial layer of silicon onto a single crystal sapphire surface such that single crystal growth of the silicon layer (necessary for transistor fabrication) is promoted. Epitaxial deposition refers to any process for growing single-crystal layers upon another substrate. While some success has been made with this technology, several significant problems exist. Namely, large thermal mismatches may exist between the sapphire substrate and the silicon layer, and the process yields a silicon layer with residual defects and lacking a unique orientation. Moreover, the cost of the sapphire outweights its advantages for most commercial applications.

Other SOI approaches have also been investigated. In one of these approaches, very large doses of oxygen or nitrogen are implanted at high energy to form a buried silicon oxide or nitride layer under the bulk silicon wafer surface. Promising results have been achieved using this approach, but optimization of the ion implantation process must be accomplished to reduce the implantation time and cost to an economic level. In another approach, a polycrystalline silicon layer is deposited onto an oxidized silicon wafer and then melted to recrystallize into a single-crystal device-usable form. A third approach attaches a silicon wafer, before the integrated circuits have been fabricated, to a new substrate and etches away part of the wafer, to insulate each eventual circuit from parasitic effects.

While all of the SOI approaches attempted so far show promise in solving some of the existing material problems such as parasitic current paths, none have as yet provided cost-effective, commercially viable techniques for reproducibly fabricating large scale integrated circuits. Bi-polar activity in SOI transistors can lead to a "kink" effect, whereby excess charge carriers can distort transistor characteristics and require complicated design changes. To eliminate the kink effect, SOI transistors often require an extra terminal to bleed parasitic charge away, which makes for bulkier circuitry. Ultrathin SOI transistors can encourage parasitic bipolar transistor snap-back action that degrades circuit operation; this effect can be reduced by very low voltage CMOS circuit design. None of these SOI techniques directly addresses the fabrication problems related to photolithography and registration of short channel transistors.

Another novel MOS approach creates a Surrounding Gate Transistor (or SGT). An SGT surrounds a vertical cylindrical channel with a gate layer. A drain electrode is placed on the top portion of the vertical channel and a source electrode surrounds the channel's base. By building a MOS device upwards, horizontal chip space may be saved while also limiting parasitic current flow. In addition, SGT technology may provide similar advantages as SOI methods for minimizing hot electron degradation effects. However, the SGT techniques may have difficulty controlling critical channel length dimensions, since these depend on etch-depth tolerances, and the techniques still require all the complex processing steps of conventional CMOS devices.

What is needed is an improved method and system for fabricating MOS integrated circuits which allows for increased miniaturization of individual circuit elements. More specifically, the method should resolve both the process problems of photolithographic circuit resolution and pattern registration and the material problems associated with the close proximity of conventional MOS devices, such as latch-up and parasitic current flows. In addition, the method should provide a simple and cost-effective technology for reliably producing VLSI integrated circuit chips.

SUMMARY OF THE INVENTION

In accordance with the present invention, a vertical MOS device comprises a vertical gate post rising and electrically insulated from a substrate, a channel layer connecting to the gate post, and a pair of source/drain layers occupying the upper and lower surfaces of the channel layer. To achieve the novel structure of the present invention, and improved MOS manufacturing process combines a deposition of variously doped silicon layers and etching through the silicon layers, using deposited spacers as masks, to form vertical MOS circuit components. The inventive method requires relatively few photolithographic masks, lessening registration and linewidth resolution requirements, and enabling smaller and more dense circuitry to be fabricated using current lithographic apparatus. Further, critical circuit parameters such as channel length may be determined by precise epitaxial deposition instead of lithographic dimensions, allowing for tighter transistor tolerances.

A first step in the method of the present invention involves fabricating a substrate with a series of uniformly layered vertical semiconductor depositions on its upper surface. In one embodiment, these depositions may be made with molecular beam or CVD epitaxy for improved layer control. A simple inverter formed of two vertical transistors will be used as a sample circuit to explain the general inventive principles. Starting with a thick $p^+$ substrate, a $p^+ - n - p^+$ series of layers are deposited epitaxially (to form an eventual PMOS transistor), then a set of separation (or barrier) layers of n and $p^+$ material, and then an $n^+ - p - n^+$ series of layers (to form an NMOS transistor). A "+" in the superscript of the layer doping indicates a heavier (or enhanced) doping, usually near saturation, and therefore greater than that of an un-superscripted layer (e.g. a $p^+$ layer has a greater concentration of hole carriers than does a p layer).

In a second step of the method, a series of oxide and nitride spacers are deposited on the surface of the substrate, leaving exposed areas which will form the sites of posts around which annular vertically-spaced transistors will be constructed. To form the spacers, first a relatively thick layer of oxide is deposited upon the upper surface of the deposited substrate (the $n^+$ layer). Photoresist is applied and exposed using a photolithographic mask, allowing regularly spaced square, rectangular or circular areas of the oxide layer to be etched away. A thin nitride spacer is formed by a conventional spacer fabrication process along the inner wall of each of these holes in the first oxide layer, and then another thin oxide spacer is deposited next to the nitride spacer, leaving a smaller square, rectangular or circular area of the upper $n^+$ layer exposed at each post site.

In a third step, a central post that serves both to support the vertical transistors and also to apply gate voltages to each is constructed within the area left exposed in the second step. To create the central post, a hole is etched within the exposed area down to and partly into the first $p^+$ substrate layer. Then, a thick layer of oxide is deposited into the bottom of the etched well, and a thin layer of oxide is formed along the walls. The thin oxide layer will provide the gate oxide separation layer for the two vertical transistors. The hole is then filled with a conductive material such as polycrystalline silicon up to the oxide spacer and is topped off by a nitride layer which connects to the nitride spacer, essentially burying the oxide spacer.

In a fourth step, the first, upper vertical transistor is constructed out of the top three epitaxial layers. As a preliminary step, the exposed oxide layer which had formed the initial mask for constructing the gate posts is removed. Next, using the nitride spacer left exposed as a mask, a trench is etched vertically through the uppermost $n^+$ layer, the next p layer and into the next $n^+$ layer. Thermal oxidation then forms a thin protective oxide coating on the exposed face of the upper NMOS vertical transistor. A second nitride spacer is deposited next to the first nitride spacer and down across the back face of the NMOS transistor, and an anisotropic vertical etch removes the bottom oxide layer to allow for further vertical etching.

In a fifth step, the barrier layer separating the two transistors is removed. Using the second nitride spacer as a mask, a deeper trench is etched through the lower n+ layer of the upper vertical transistor, through the p+ barrier layer and into the n barrier layer. A third nitride spacer layer is deposited next to the second spacer, and the bottom layer of nitride is removed. A wet, dopant-sensitive etch removes the entire n barrier layer everywhere. A thin oxide layer is thermally grown along the exposed portions between the two transistors and the volume between them is then filled with a thicker oxide, the face of which is covered by a fourth nitride spacer.

In a sixth step, the second transistor is fabricated. A silicon anisotropic etch, using the fourth nitride layer as a mask, cuts a trench through the p+, n and into the bottommost p+ layer to form the lower PMOS transistor. An oxide layer is then formed on the face of the exposed silicon layers of the lower transistor.

In a seventh step, the substrate and its array of vertical transistors surrounding isolated posts is cleaned up through several etchings, and metal connections are attached. First, all nitride layers and spacers are removed. Then a vertical anisotropic etch removes any oxide layers on the horizontal silicon surfaces, allowing electrical and mechanical connection between a metal deposition, such as a selective tungsten deposition, and the exposed shelves of each transistor (including the top surface of the polycrystalline gate post). The volume between each inverter "island" (comprising a gate post surrounded by two vertical annular transistors) can be filled with a dielectric material. This dielectric material is then etched to form steps. Various interconnections between transistors can be laid along these steps in order to construct complex digital circuitry.

The present invention provides a novel and efficient approach for fabricating very large scale integrated circuits. Using only one lithographic mask, the process allows extremely tight spacing of individual circuit elements without sacrificing circuit performance. The placement and size of the central gate post, the principal feature of the lithographic mask, determines the spacing and size of each transistor across the wafer. Having only one processing mask (other masks may be employed later for constructing the metal wire interconnects) reduces considerably the registration problems inherent in multiple-mask approaches, while also reducing the device area consumed by source, drain and gate areas. The present invention provides a fabrication technique well-suited for single wafer processes currently being implemented, often in cluster tool fabrication systems.

In addition, the unique vertical arrangement of the individual transistors allows the nitride and oxide spacers to function as process masks, accurately and uniformly configuring each transistor's channel depth, while precise epitaxial deposition of the channel layer determines channel length. Further, the vertical construction of each transistor provides the operational characteristics of silicon-on-insulator technology, since each channel annular region has a "bottom" portion (in the described configuration, actually the sides of the channel region) connected only to the dielectric fill material, minimizing possible parasitic current paths. By having the NMOS and PMOS transistors occupying the same wafer area, circuit density can be greatly increased.

The width of the channel region in the present invention runs all the way around the transistor annulus. Thus, the channel width for transistors constructed according to the present invention can be at least four times as wide as the channel width of prior MOS transistors, for the same relative transistor width. The increased channel width provides improved transistor characteristics and operating stability and the annular shape eliminates channel edge effects. These and other features and advantages of the present invention are apparent from the description below with reference to the following drawings.

DESCRIPTION OF THE PREFERRED EMBODIMENTS

Figure 1A:
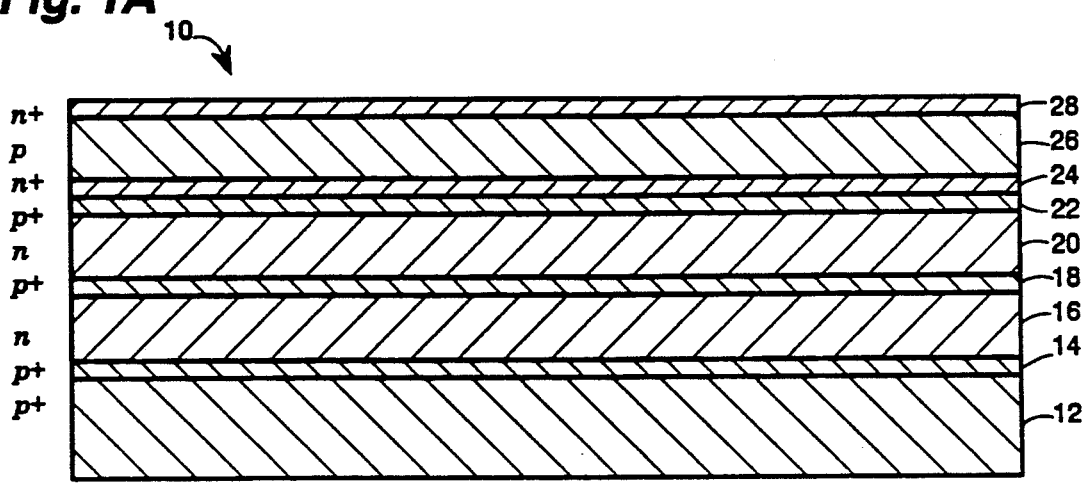
FIGS. 1A through 1S shown cut-away views representing stages in the fabrication of a vertical CMOS device in accordance with the present invention.
Figure 1B:
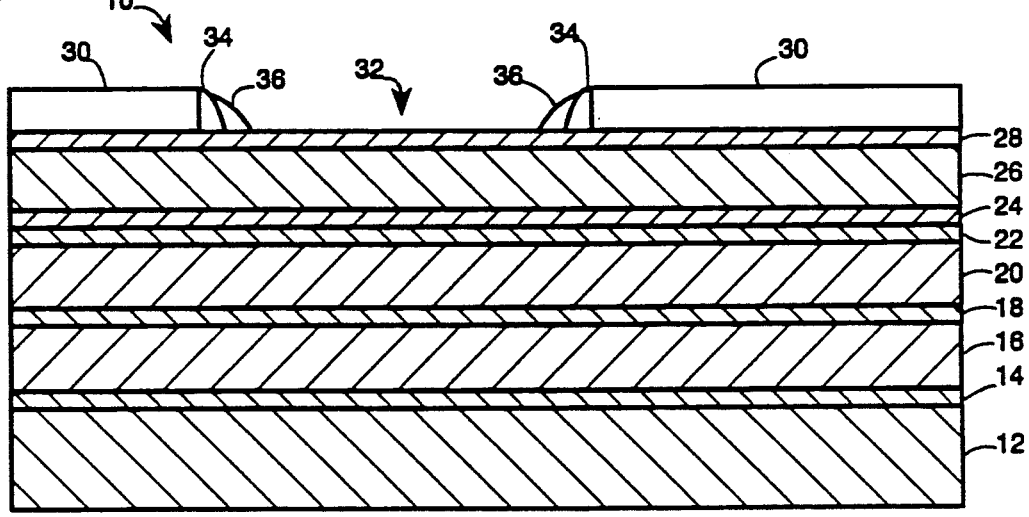
Figure 1C:
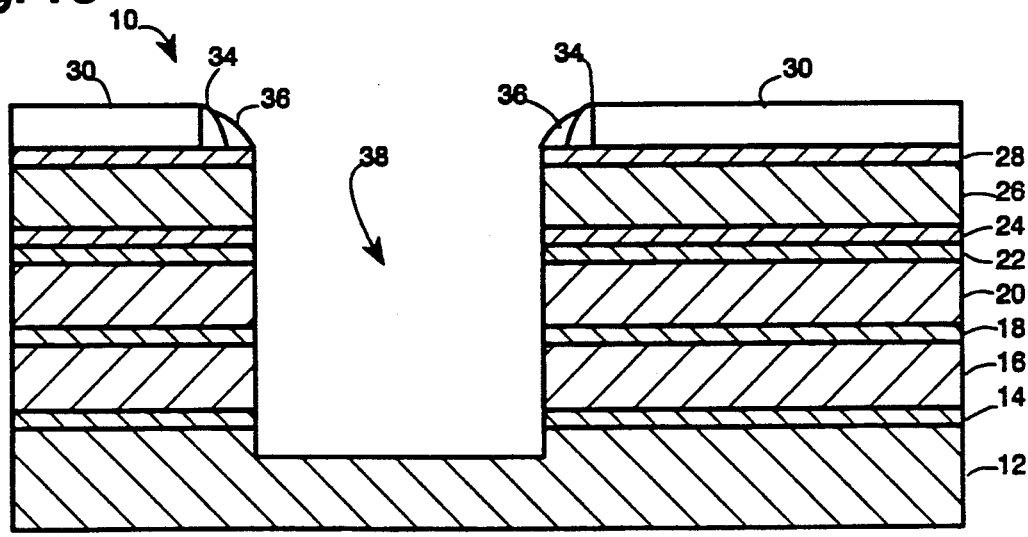
Figure 1D:
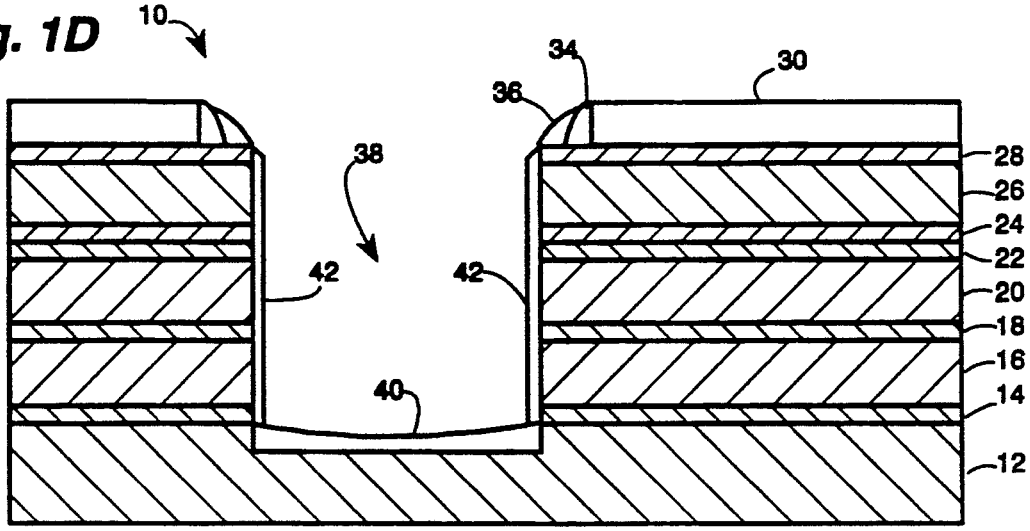
Figure 1E:
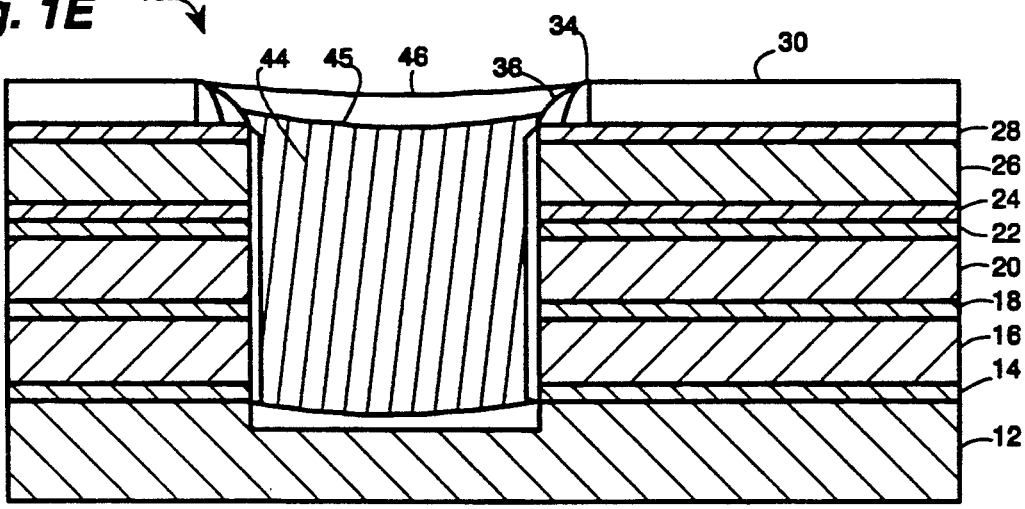
Figure 1F:
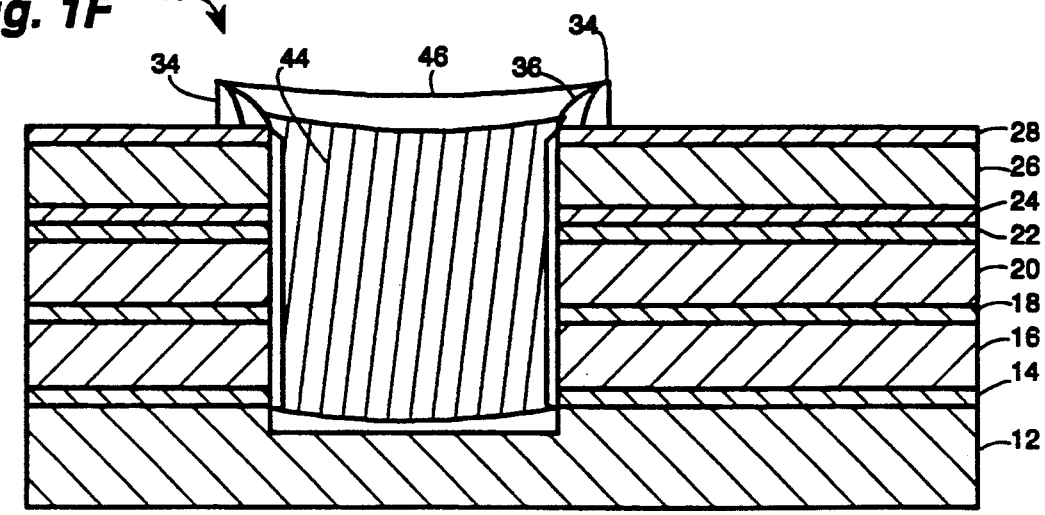
Figure 1J:
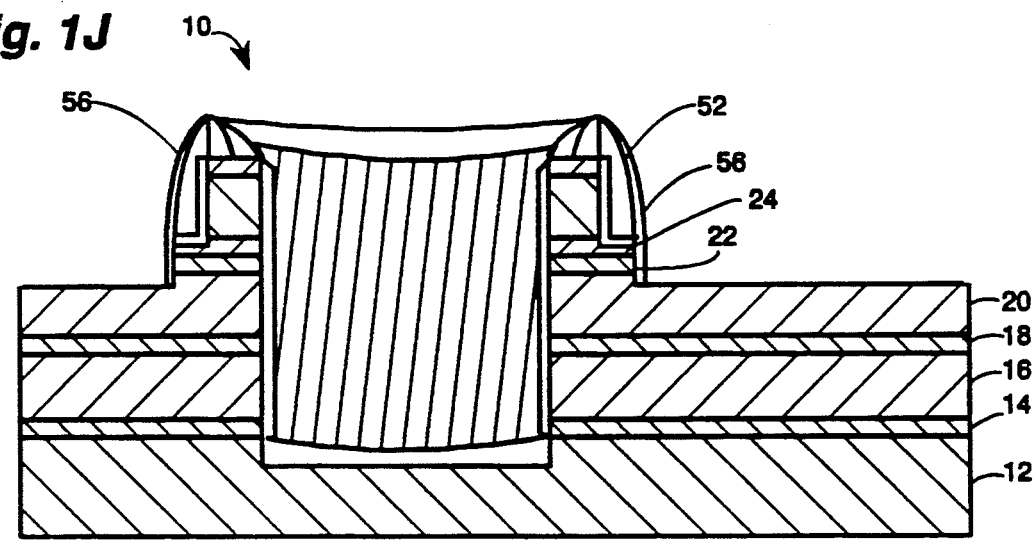
Figure 1K:
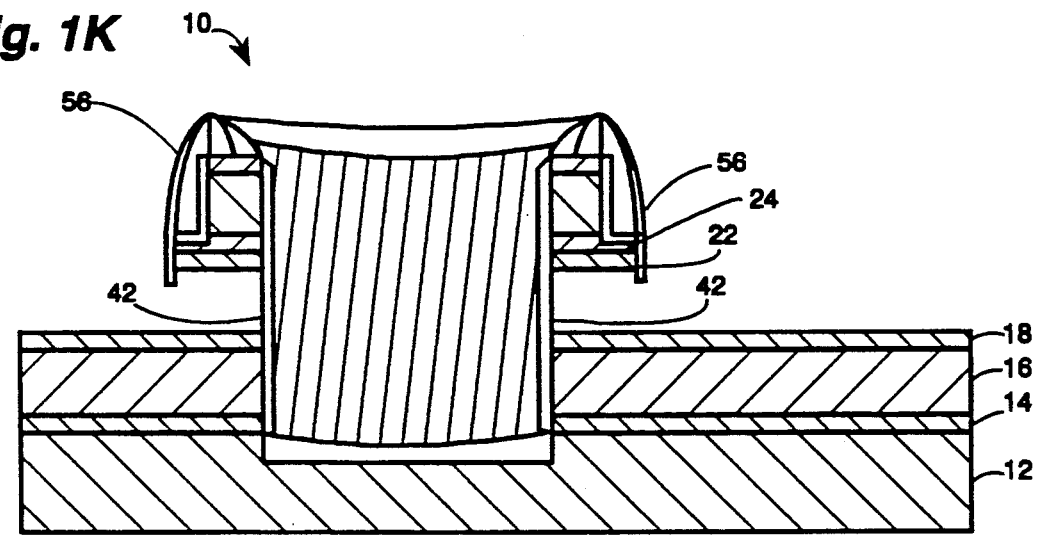
Figure 1L:
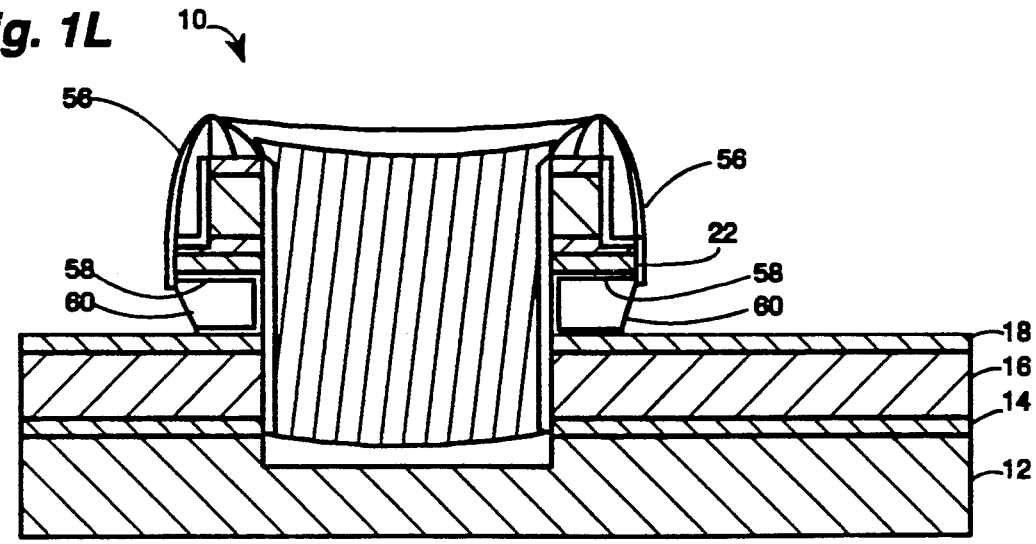
Figure 1M:
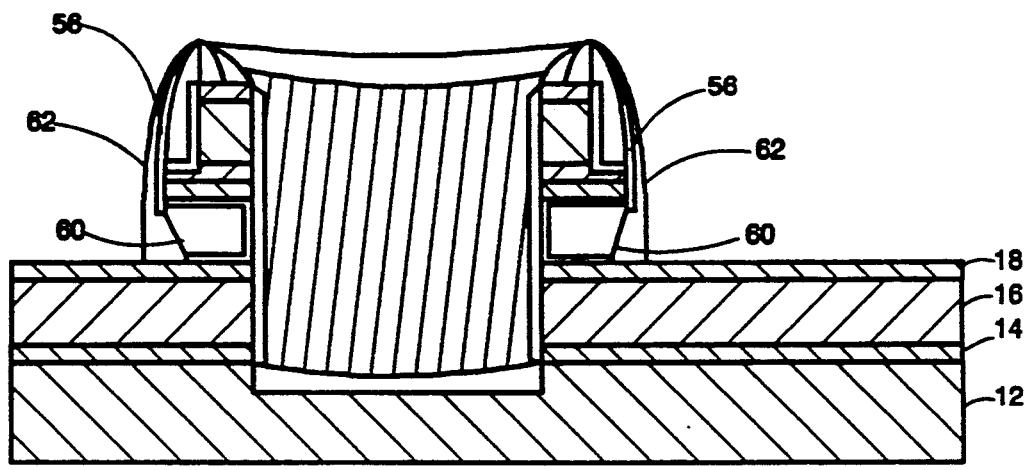
Figure 1N:
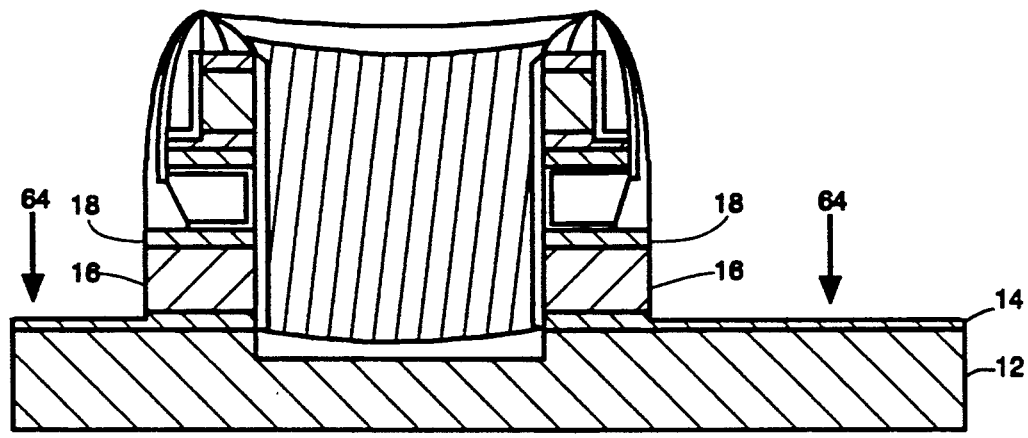
Figure 1P:
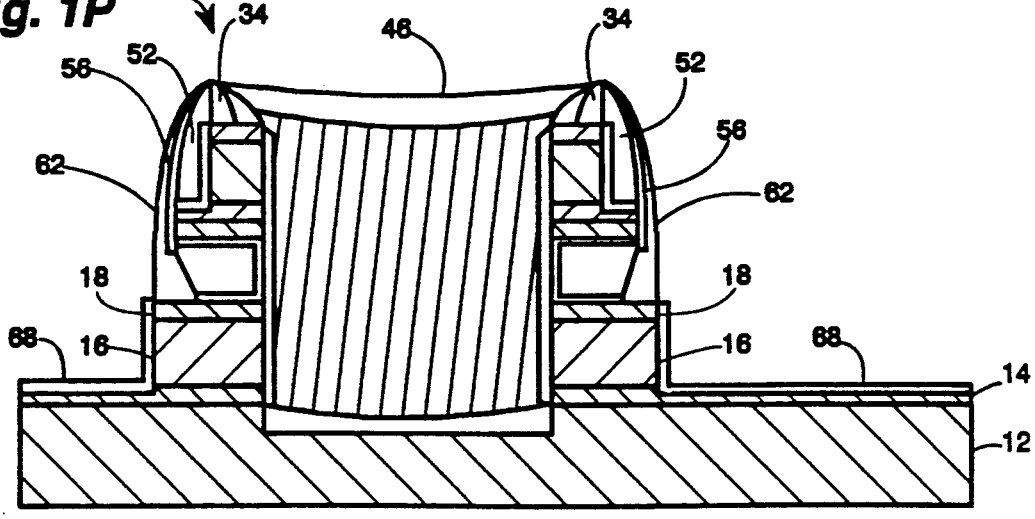
Figure 1Q:
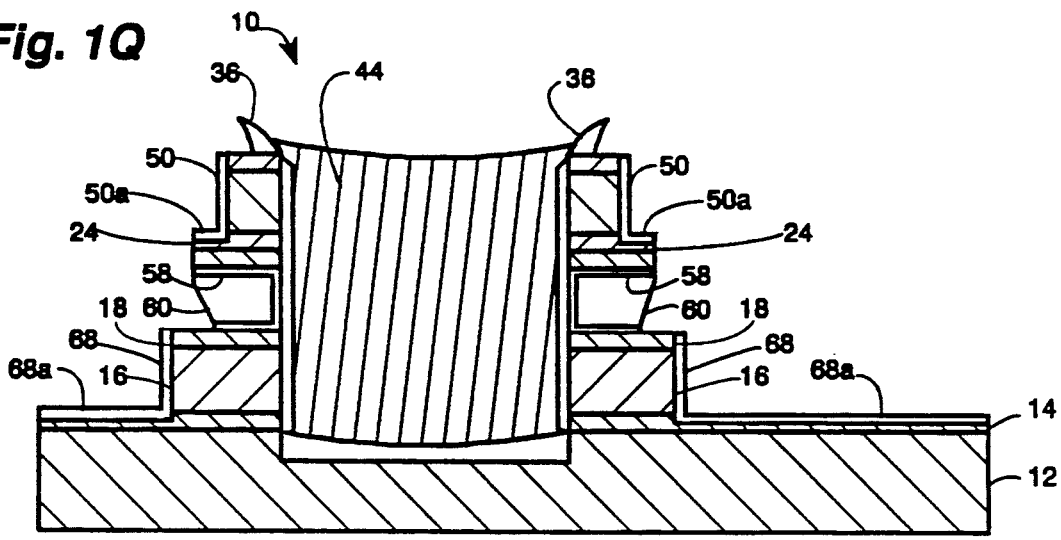
Figure 1R:
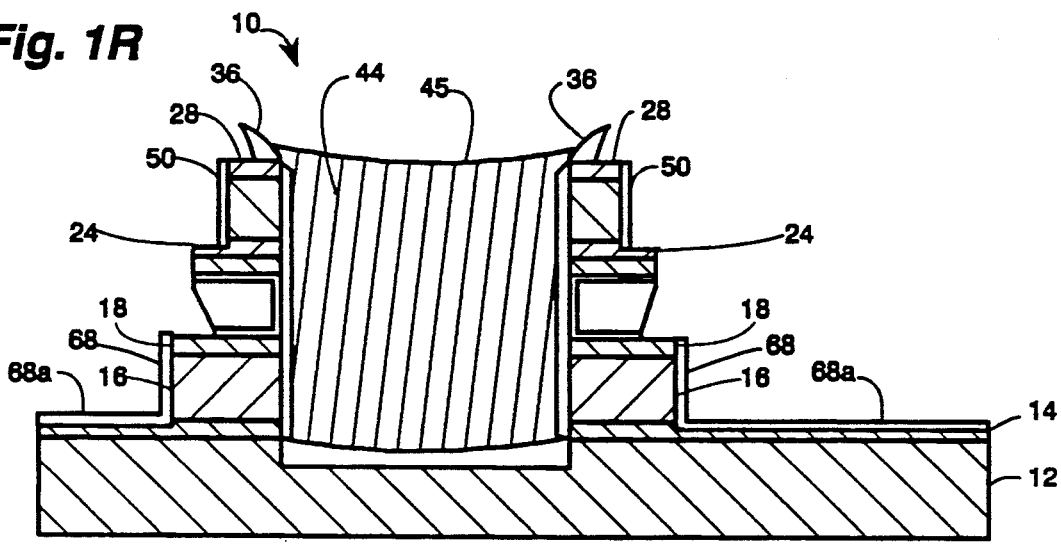
Figure 1S:
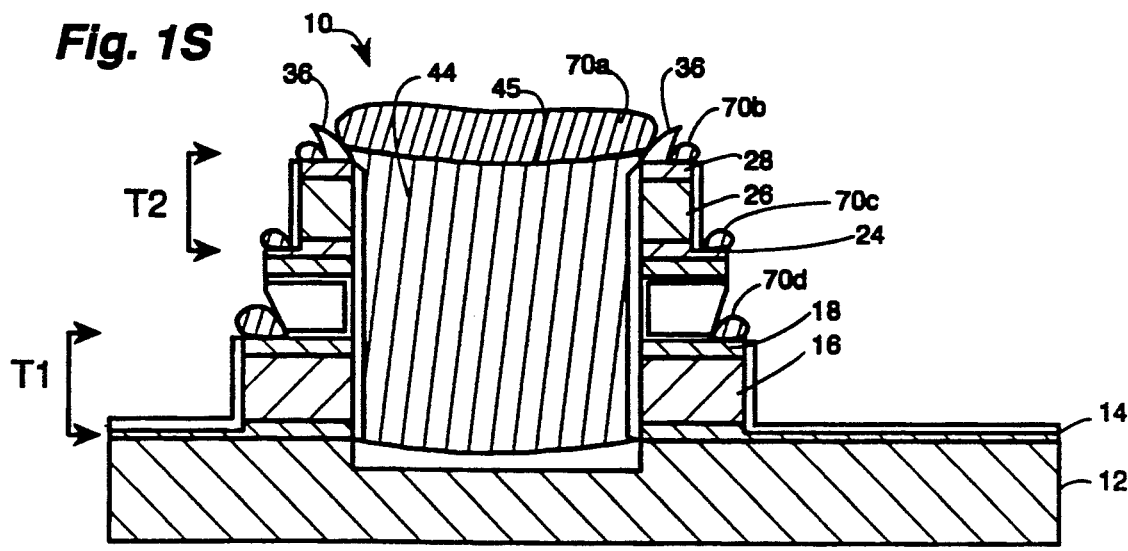

In accordance with the present invention, a method for fabricating vertical CMOS electrical components is illustrated in FIGS. 1A through 1S. FIG. 1A presents the starting point for the present invention and reveals a silicon wafer 10 in cross-section containing a series of alternately doped silicon layers. The first p+ layer 12 is a relatively thick silicon wafer and forms the structural substrate for the circuit components to be constructed. The wafer's thickness depends upon the structural characteristics required and upon the diameter of the wafer used. Next, a series of silicon layers are epitaxially deposited on top of the substrate p+ layer 12. First, a thin p+ layer 14 ($\sim$0.03 $\mu$ms), a somewhat thicker n layer 16 ($\sim$0.1 $\mu$ms) and another thin p+ layer 18 ($\sim$3.03 $\mu$ms) are deposited. The p+−n−p+ layer series, subject to further fabrication steps, will form the first vertical transistor above substrate 12. The n middle layer 16 functions as the first transistor's channel layer, while the first and second p+ layers 14, 18 may function as source or drain layers, depending upon eventual circuit connections. For this reason, they will be termed source/drain layers for the remainder of the description.

Next, a thicker n layer 20 ($\sim$0.3 $\mu$ms) is deposited followed by another thin p+ layer 22. These two layers separate the two vertical transistors from one another and are useful for several of the subsequent processing steps. Finally, the second vertical transistor region is formed by epitaxially depositing an n+ source/drain layer 24, a p channel layer 26 and another n+ source/drain layer 28, the layers approximately duplicating the layer thicknesses chosen for the first transistor. In the present embodiment, the substrate layer 12 and the first source/drain layer 14 are both of p+ semiconductor material, but this is not necessary and various other combinations are also possible. In addition, the substrate serves as a power supply connection $V_{DD}$ to the circuitry.

A thick oxide layer 30 (approximately 0.5 to 1.0 $\mu$ms), deposited over the top n+ layer 28, is masked and etched to form an aperture 32 approximately 1.0 $\mu$ms wide, extending down to upper n+ layer 28, as shown in FIG. 1B. Nitride is deposited along the inner wall of aperture 32 to form a first nitride spacer 34, approximately 500 Å wide. Oxide is deposited next to the first nitride spacer 34, to form an oxide spacer 36, also approximately 500 Å wide. All spacers used in the preferred embodiment are formed in the same way. First, a conformal (or isotropic) deposition of the particular material leaves a constant thickness of material, for example nitride, everywhere, especially down the face of a stair-step. In the present instance, the stair-step would comprise the inner wall of aperture 32. Second, an anisotropic vertical etch removes all material along exposed horizontal portions of the wafer, leaving most of the spacer intact along the wall of the stair-step.

Using the collection of oxide layer 30, nitride spacer 34 and oxide spacer 36 as a mask, a hole 38 is cut through aperture 32, through all of the epitaxially-deposited layers 14 through 28 and into the substrate layer 12, as illustrated in FIG. 1C. Any anisotropic silicon etching process may be employed to cut hole 38. Using electron cyclotron resonance deposition (ECR), or other similar anisotropic deposition techniques, the bottom portion of the hole is filled with an oxide deposit 40 to a depth of about 0.15 μms, depending on the depth of the etch, so that its top edge aligns closely with the top of layer 12, as seen in FIG. 1D. An isotropic clean-up etch removes any oxide left on the side-walls of hole 38. Then, using a furnace or rapid thermal process (RTP), a thin layer of high-quality gate oxide 42 is grown along the walls of hole 38. As familiar to the art, the oxide deposit may be accomplished by raising the substrate to a carefully controlled temperature of approximately 800° C. in an oxygen environment. RTP can raise substrate temperature while avoiding substantial interdiffusion of the epitaxial layers.

Hole 38 is next filled with polysilicon doped with enough impurities to function as a highly-conductive gate post 44. A chemical vapor deposition (CVD) process may be used to fill hole 38 with the polysilicon. The polysilicon of gate post 44 is etched back so that its upper edge 45 locates near the center of oxide spacer 36, but above the upper n+ layer 28. The remaining depression in hole 38 is filled with a nitride layer 46 by depositing a layer of nitride across the wafer, and then etching the nitride back (with a resist etch-back process) so that it just fills the depression left in hole 38.

The original oxide layer 30 is removed from the top of wafer 10 using an oxide-selective etch (such as applying hydrofluoric acid) leaving the faces of the first nitride spacer 34 exposed, as revealed in FIG. 1F. Next, a vertical silicon etching process etches a trench 48 into the epitaxial layers, using the first nitride spacer 34 and nitride layer 46 as a mask. End-point detection, which is sensitive to dopant concentration of the current etch layer, allows the vertical etching process to end on a particular layer. In the first trech etching, the process ends on or in n+ layer 24, as shown in FIG. 1G. The exposed faces of n+ layer 28, p layer 26 and n+ layer 24 are then coated with a thin protective oxide layer 50 using a rapid thermal oxidation process.

A second nitride spacer 52 is applied to the exposed side of first nitride spacer 34, and down the vertical faces of the first transistors layers 28, 26 and 24. The remainder of the exposed oxide layer 50 is then removed, as shown in FIG. 1H, re-exposing n+ layer 24. Using the second nitride spacer 52 as a mask, a second trench 54 is etched through the n+ layer 24, p+ buffer layer 22 and into the n buffer layer 20, as illustrated in FIG. 1I. A third nitride spacer 56 is deposited along the side of second nitride spacer 52 and the exposed vertical faces of layers 24, 22 and 20, and any remaining nitride left on the exposed horizontal areas of n layer 20 is removed as shown in FIG. 1J. A dopant-selective wet etch then removes the entire n layer 20 up to oxide layer 42 surrounding polysilicon gate post 44. The resulting structure is shown in FIG. 1K. Thermal oxidation applies a thin oxide layer 58 on all exposed silicon and a second oxide deposition 60 fills in the cavity left between the first and second transistor layers (i.e. between layers 22 and 18). Oxide depositions 58 and 60 are then etched back anisotropically, using third nitride spacer 56 as a mask, allowing the next p+ layer 18 to be exposed, as shown in FIG. 1L.

Next, a fourth nitride spacer 62, deposited against the third nitride spacer 56, extends downwards against oxide deposition 60 to p+ source/drain layer 18, as shown in FIG. 1M. Using fourth nitride spacer 62 as a mask, an anisotropic etch excavates a third trench 64 extending through the p+ source/drain layer 18, through n channel layer 16 and into p+ source/drain layer 14, as shown in FIG. 1N. Again, thermal oxidation deposits a thin oxide layer 68 over the exposed vertical faces of the second transistor layers 14, 16 and 18 and over the exposed horizontal face of layer 14 as illustrated in FIG. 1P.

Removing, through appropriate etches, all nitride spacers 34, 52, 56, and 62 and nitride layer 46 leaves the structure as seen in FIG. 1Q. An anisotropic etch removes oxide layer 50a (the suffix "a" denotes the horizontal components of this conformal oxide layer 50) on the horizontal silicon surface of layer 24, shown in FIG. 1R. Finally, a metal connection 70 of tungsten is grown on the exposed horizontal ledges of all silicon areas (silicon layers 18, 24, and 28 and the upper surface 45 of polysilicon gate post 44). The original oxide spacer 36 prevents the connection 70a on gate post 44 from connecting with electrical connection 70b on upper source/drain layer 28 of the upper vertical transistor. The resulting arrangement is revealed in FIG. 1S.

The fabrication of the vertical CMOS inverter is now essentially complete. As shown in FIG. 1S, vertical polysilicon gate post 44 rises from the silicon substrate 12 surrounded by two transistors T1 and T2. The individual layers of each vertical transistor surround the vertical gate post 44 and mirror its geometry. For instance, if the gate post 44 were round, the transistors and their layers would have a round annular geometry; if the gate post were square, the transistor layers would have a square annular geometry (annular in this context describes an enclosed region having a smaller central portion removed of the same boundary shape). Transistor T1 comprises p+ source/drain layer 14, n channel layer 16 and p+ source/drain layer 18, and their associated connections 70a, 70d and substrate layer 12. Transistor T2 comprises n+ source/drain layer 24, p channel layer 26 and n+ source/drain layer 28, and their associated connections 70a, 70b and 70c.

The channel length, the distance between the two source/drain layers of an individual transistor, is determined in the preferred embodiment by the epitaxial layer thickness, not the placement and resolution of a photolithographic mask. Epitaxial deposition allows for much tighter control over this thickness and therefore over transistor operational characteristics. In addition, by orienting the transistor vertically, in contrast to conventional horizontal technology, and removing any silicon material from the underside of the channel (that portion below the source/channel/drain regions of a conventional MOS transistor and opposite the gate) any path for spurious parasitic current to flow is removed as with SOI transistors. Hence, the present novel approach furnishes greater control over transistor operation. The gaps left in the substrate from the trench-etching operations may be filled with a dielectric material, thereby covering the underside of the channel region with an insulator and yielding true silicon-on-insulator transistors.

Figure 2:
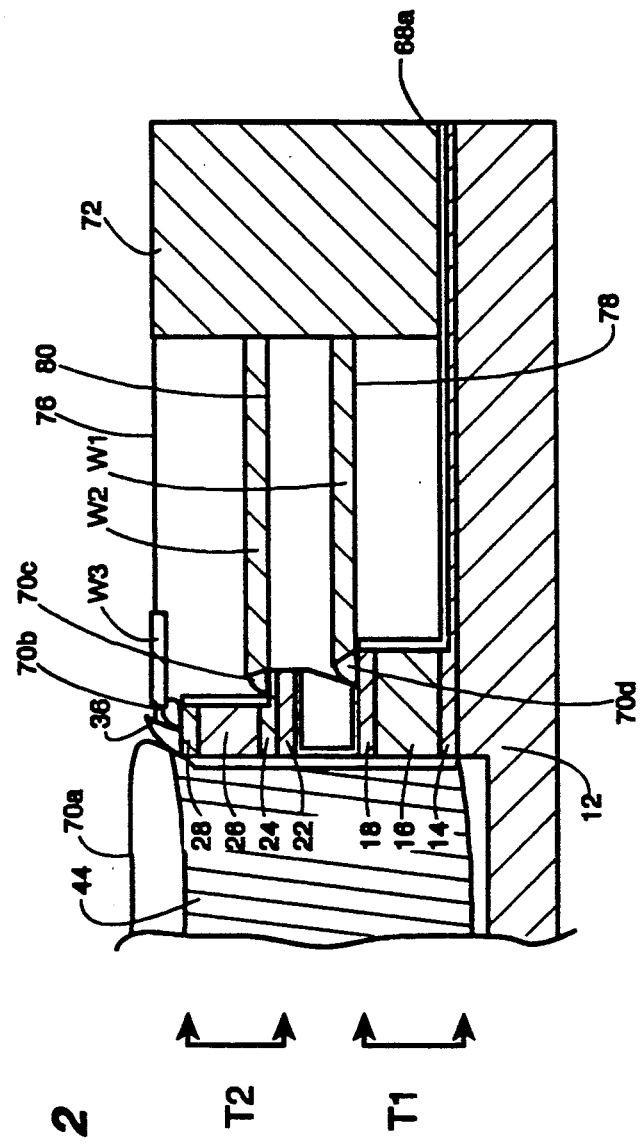
FIG. 2 shows a cut-away view of a vertical CMOS inverter device and its associated metallic traces and via in accordance with the present invention.

To create a usable integrated circuit, one needs to connect the two transistors to each other, to other transistors and circuit elements on the chip, and/or to connections with the outside world. To accomplish this, a series of steps selectively fill the open areas between the gate post/transistor "islands" and other deposited vias (electrical posts that penetrate multiple layers in the substrate) with a dielectric material, and etch the dielectric fill to particular levels to lay down metal interconnections. To illustrate the procedures, FIG. 2 shows one-half of the previously-constructed vertical gate post 44 and transistors T1 and T2.

Figure 3A:
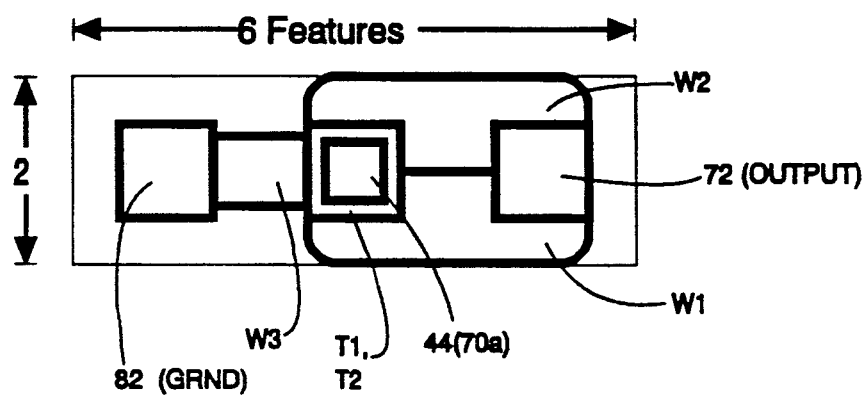
FIGS. 3A and 3B illustrate an upper view and an electrical schematic diagram, respectively, of an electrical inverter incorporating vertical CMOS devices in accordance with the invention.

The first step in the connection procedure consists of filling the substrate up to above top layer 28 with a dielectric material 76 such as an oxide. A first interconnect mask is used to pattern via 72, which is etched partway to layer 14 leaving oxide insulation layer 68a. Via 72 is then filled with a tungsten plug using a blanket deposition of tungsten which then is etched back. A second interconnect mask is employed to expose a portion of the dielectric material around gate post 44 (and transistors T1 and T2) and via 72. The outline of the masked area can be seen as area W1 in the plan view of the inverter shown in FIG. 3A. In FIG. 3A, the inverter island comprises a square vertical gate post 44 surrounded by the stacked, square annular transistors T1 and T2 as previously described. The upper surface of gate post 44 has the metallic connection 70a attached, as shown in FIG. 2. After the area W1 is exposed by the mask, the dielectric is etched down to the level of source/drain layer 18 of transistor T1, forming a shelf 78 running from connection 70d on source/drain layer 18 to via 72. Before removal of the second interconnect mask, a silicon implantation into the shelf 78 creates a nucleation layer for selective tungsten deposition.

The second interconnect mask is removed and a third interconnect mask is applied, this time exposing area W2 in FIG. 3A. The dielectric layer 76 is etched in area W2 down to the level of source/drain layer 24 of transistor T2, exposing a shelf 80 of dielectric running from connection 70c to via 72. Once these shelves 78 and 80 are exposed and implanted with silicon, a second metal deposition forms connections W1 and W2 from the inner source/drain layers 18 and 24 of transistor T1 and T2 to via 72, effectively connecting these closest layers of the two transistors together. After these connections have been made, the trenches left in the dielectric layer 76 may be refilled to provide a solid substrate.

Figure 3B:
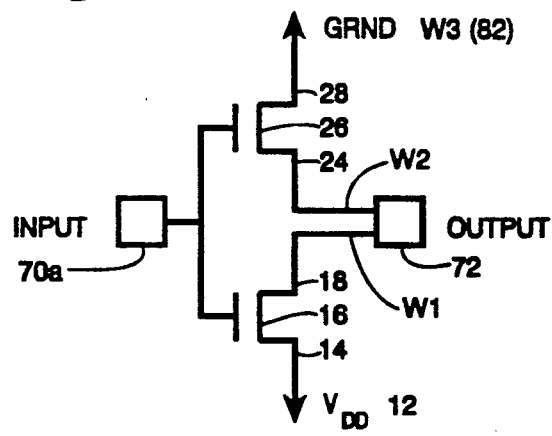

A final masking step constructs a top-level connection W3, from the top source/drain layer 28 of transistor T2 to another via 82, which connects the transistors to ground as shown in FIGS. 3A/B. Top-level metallic trace can then be fabricated to connect the output via 72, the input connection 70a for gate post 44, and the ground via 82 to appropriate other portions of the integrated circuit. The resulting schematic for the inverter may be seen in FIG. 3B, where appropriate physical portions of the circuit are also noted. In the present embodiment, substrate 12 provides the $V_{DD}$ voltage for circuit operation, through its direct connection with first transistor layer 14. As can be seen in FIG. 3A, if the physical area of the gate post 44 determines the fundamental feature size of the integrated chip, the entire inverter requires only two features by six features for fabrication, significantly reducing the horizontal room required per inverter.

Although the present description focused on an inverter element comprising two transistors and associated vias, the present invention may be adapted to a wide variety of circuit designs. Each different circuit embodiment depends only upon how the individual connections W are formed between each transistor layer. For example, one transistor of the vertical pair may remain unconnected, using only one of the vertical transistors from each gate post. Or, the transistors between gates may be connected in much more complicated ways to achieve circuit design goals as understood by those skilled in the art of integrated circuitry. Further, it is not necessary to fabricate two stacked transistors on top of one another. If only one vertical transistor is required, layers 20 through 28 need not be deposited and the process may be followed by depositing the oxide layer 30 onto the now upper source/drain layer 18, and proceeding with the remainder of the process steps. Or, three or more transistors may be fabricated as necessary for circuitry designs. Also, the vertical transistors need not completely encircle the central gate post, but can be further patterned. Thereby, several individual transistors at the same level can be formed, each transistor only partially surrounding the gate post. And, as described, the substrate need not provide $V_{DD}$ for circuit operation, and the vertical transistors need not directly contact the substrate. These and other variations upon and modifications to the described embodiments are provided for by the present invention, the scope of which is limited only by the following claims.

What is claimed is:

1. A vertical metal-oxide semiconductor device comprising:
   a substrate, said substrate defining a horizontal plane and a vertical direction normal to said horizontal plane;
   a substantially vertical gate structure disposed above said substrate, said vertical gate structure being formed of conductive material;
   a first channel region surrounding said vertical gate structure, said first channel region having a first conductivity type;
   a gate oxide disposed between and contacting said vertical gate structure and said first channel region:
   a first source/drain region above said substrate, said first source/drain region being below and attached to said first channel region, said first source/drain region having a second conductivity type opposite to said first conductivity type; and
   a second source/drain region above said substrate, said second source/drain region being above and attached to said first channel region, said second source/drain region having said second conductivity type.

2. A vertical metal-oxide semiconductor device as recited in claim 1 wherein said substrate includes a semiconductor layer and an insulator layer, said insulator layer being disposed between said semiconductor layer and said vertical gate structure.

3. A vertical metal-oxide semiconductor device as recited in claim 1 wherein said substrate includes an insulating layer.

4. A vertical metal-oxide semiconductor device as recited in claim 1 wherein said first channel region and said source/drain regions are epitaxial.

5. A vertical metal-oxide semiconductor device as recited in claim 1 wherein said first channel region and said source/drain regions are electrically insulated from said substrate.

6. A vertical metal-oxide semiconductor device as recited in claim 1 wherein said semiconductor device is a transistor.

7. A vertical metal-oxide semiconductor device as recited in claim 1 wherein said semiconductor device is a silicon-on-insulator device.

8. A vertical metal-oxide semiconductor device as recited in claim 1 wherein said first channel region is sufficiently shallow to be fully depletable of majority carriers.

9. A vertical metal-oxide semiconductor device comprising:
- a substrate defining a radial plane and a vertical direction normal to said radial plane;
- a substantially vertical gate structure disposed above said substrate, said vertical gate structure being formed of conductive material;
- a first channel region having a first conductivity type, said first channel extending radially from said vertical gate structure;
- a gate oxide disposed between and contacting said vertical gate structure and said first channel region;
- a first source/drain region having a second conductivity type opposite to said first conductivity type, said first source/drain region being above said substrate, said first source/drain region bounding said first channel region from below;
- a second source/drain region having said second conductivity type, said second source/drain region bounding said first channel region from above;
- a first contact of conductive material electrically and physically connected to said second source/drain region;
- a second channel region having a third conductivity, said third conductivity type being the same as one of said first and second conductivity types, said second channel region surrounding said vertical gate structure, said second channel region being above said second source/drain region;
- a third source/drain region having a fourth conductivity type opposite said third conductivity type, said third source/drain region being above said second source/drain region, said second source/drain region bounding said second channel region from below;
- a second contact of conductive material electrically and physically connected to said third source/drain region; and
- a fourth source/drain having said fourth conductivity type, said fourth source/drain layer structure bounding said second channel region from above.

10. A vertical metal-oxide semiconductor device as recited in claim 9 wherein said second source/drain region is electrically coupled to said third source/drain region.

11. A vertical metal-oxide semiconductor device as recited in claim 9 wherein said first source/drain region is electrically coupled to said fourth source/drain region.

12. A vertical metal-oxide semiconductor device as recited in claim 9 wherein said regions are epitaxial.

13. A vertical metal-oxide semiconductor device as recited in claim 9 wherein said first and second channel regions surround said gate structure.

14. A vertical metal-oxide semiconductor device as recited in claim 9 wherein said third conductivity type is the same as said second conductivity type.

* * * * *